United States Patent [19]

Davis et al.

[11] 4,175,980
[45] Nov. 27, 1979

[54] LUMINESCENT SOLAR COLLECTOR

[75] Inventors: Robert R. Davis, Arcadia, Calif.; Richard C. Sill, Reno, Nev.; John W. Yerkes, Granada Hills, Calif.

[73] Assignee: Atlantic Richfield Company, Los Angeles, Calif.

[21] Appl. No.: 970,771

[22] Filed: Dec. 18, 1978

[51] Int. Cl.² ............................................. H01L 31/04
[52] U.S. Cl. .............................. 136/89 FC; 250/227; 136/89 CA
[58] Field of Search ........ 136/89 FC, 89 LL, 89 CA; 250/227

[56] References Cited

U.S. PATENT DOCUMENTS 4,130,445 12/1978 Blieden ............................ 136/89 PC
4,135,537 1/1979 Blieden et al. .................. 136/89 PC Primary Examiner—Aaron Weisstuch
Attorney, Agent, or Firm—Roderick W. MacDonald

[57] ABSTRACT

A luminescent solar collector comprising at least one luminescent member which has at least one photovoltaic means operably associated therewith, the luminescent member having a side which is to be essentially oriented toward the sun when in operation, and an optically transparent member on the sun-facing side of the luminescent member, the transparent member being spaced from the sun-side to provide space between the luminescent member and the transparent member, the transparent member being essentially coextensive with the luminescent member.

3 Claims, 5 Drawing Figures

LUMINESCENT SOLAR COLLECTOR

BACKGROUND OF THE INVENTION

It is known that a photovoltaic semiconductor p-n junction can convert to electricity only that portion of the incident photon energy spectrum, typically solar radiation, which creates hole-electron pairs within a given semiconductor material. For example, in a silicon photovoltaic cell only that portion of the solar spectrum with energy slightly greater than or equal to the 1.1 electron volt band gap is efficiently converted into electricity. Photons of lesser energy are not absorbed at all. More energetic photons are absorbed and most of the energy lost in heating the cell. It is this heating and absorption process which can degrade the cell's energy conversion efficiency. To maximize the efficiency of a given photovoltaic cell, it is advantageous to convert as much of the available light as possible into an energy range to which such cell can optimally respond in the generation of electricity before the light strikes the cell's surface.

One technique for achieving such conversion takes advantage of the fact that light falling upon a luminescent agent is characteristically reradiated or emitted in a band of wavelengths of known energy content. Also, light absorbed by such an agent in one direction is reradiated isotropically. Such agents include, for example, pigments, metal oxides and organic dyes which are used in scintillation counters, lasers, and the like. For the purpose of this invention the term "luminescent agent" includes all types of luminescent agents exhibiting all species of luminescence, including, but not limited to, fluorescence and phosphorescence.

It has been shown that the dispersal of a luminescent agent within a sheet of glass or plastic, one of whose major surfaces is exposed to light, concentrates and focuses a flux of light of known energy toward one or more of the thin edge faces of the sheet. If a photovoltaic cell responsive to light at that energy level is optically coupled to such edge face, the energy conversion efficiency of the cell increases. In this invention a light transmissive member of such construction and properties is termed a "luminescent member" and a photovoltaic solar collector employing such a member is termed a "luminescent solar collector". A luminescent solar collector of this type is fully and completely disclosed in Optics, Vol. 15, No. 10, pages 2299–2300, dated October, 1976, the disclosure of which is incorporated herein by reference.

It is desirable once light enters the interior of the luminescent member that it be internally reflected therein until it finally reaches a photovoltaic cell and does not escape out of the luminescent member by refraction or otherwise before it reaches the photovoltaic cell. This invention improves the retention of light in the luminescent member of an operating luminescent solar collector when that collector is exposed to normal weather and other operating conditions.

SUMMARY OF THE INVENTION

According to this invention there is provided a luminescent solar collector which has at least one luminescent member, which member has operably associated therewith at least one photovoltaic means, the luminescent member having a particular side (or sides) which is to be approximately oriented towards the sun when the collector is in operation, and an optically transparent member carried on said sun oriented side (or sides) of said luminescent member, said transparent member being spaced from said sun-side, said transparent member being essentially coextensive with said luminescent member.

Accordingly, it is an object of this invention to provide a new and improved luminescent solar collector.

Other aspects, objects and advantages of this invention will be apparent to those skilled in the art from this disclosure and the appended claims.

DETAILED DESCRIPTION OF THE INVENTION

Figure 1:
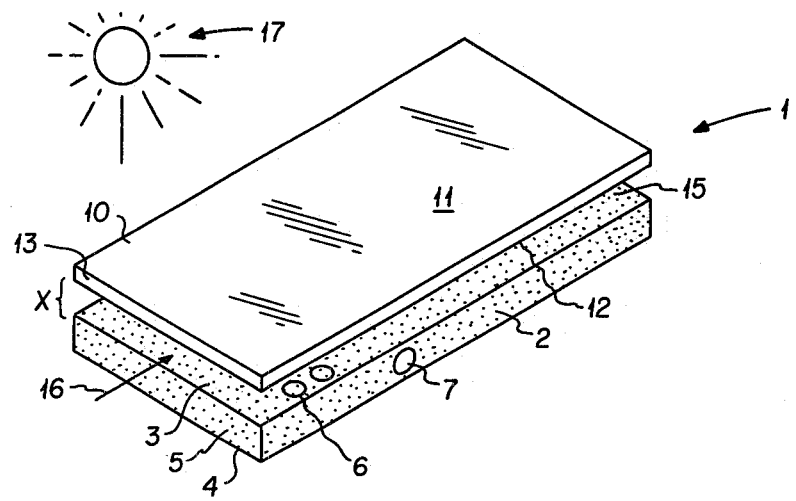
FIG. 1 shows one embodiment of a collector within this invention.

FIG. 1 shows a luminescent solar collector 1 having a lower luminescent member 2 which has an upper side 3 and a lower side 4, both sides being large surface aea sides. Member 2 has upstanding edge face 5 extending around its periphery. Bottom side 4 carries a plurality of photovoltaic cells 6 and edge face 5 also carries photovoltaic cell 7. Spaced above upper side 3 of member 2 a finite distance X is an optically transparent member 10 which has an upper large area side 11 and a lower large area side 12, the sides being connected by a peripheral upstanding edge face 13. Transparent member 10 is essentially coextensive with member 2 so that it covers essentially all of member 2 but has space between bottom side 12 of member 10 and upper side 3 of member 2, such space being designated by reference numeral 15. This space can carry, if desired, a cooling fluid passing therethrough as shown by arrow 16 for reasons which will be described hereinafter, that fluid being preferably a gas.

In normal operation upper side 3 of member 2 will be oriented generally in the direction of the sun 17 so that member 10 is carried adjacent sun oriented side 3.

Figure 2:
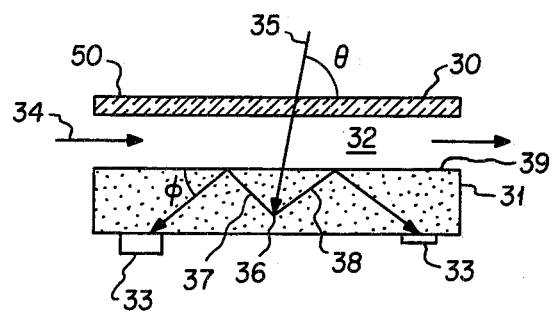
FIG. 2 shows a side view of another embodiment within this invention.

FIG. 2 shows a collector in accordance with this invention wherein upper transparent member 30 is carried spaced away from lower luminescent member 31 thereby defining space 32 between the members. As mentioned hereinabove, heat can be deleterious to the efficiency of photovoltaic cells such as cells 33 on member 31. Therefore, it can be desirable to supplementally cool member 31 such as passing a cooling fluid (liquid, gas, or mixture thereof) through space 32 as shown by arrow 34. Additionally the cooling fluid can have an index of refraction near the indices of refraction of members 30 and 31, or at least nearer than the index for air, to aid in the transmission of light through space 32, or at least make such transmission easier than if only air filled space 32.

Luminescent member 31 carries dispersed throughout the interior thereof luminescent agent(s). When a ray of sunlight 35 reaches the interior of member 31, at some point in that interior it will impinge upon a luminescent agent particle 36. The luminescent agent particle absorbs ray 35 and re-emits light in a different, lower energy range. A large plurality of subrays are emitted but only two, subrays 37 and 38, are shown for sake of clarity. The subrays are re-emitted at angles different from the original angle of incidence $\theta$ of ray 35, for example angle $\phi$ for subray 37. Because of the different angles of light emission from particle 36, reflection of the subrays off upper side 39 of member 31 is maximized. For example, subray 37 at angle $\phi$ which is different from angle $\theta$ will more likely be reflected off side 39 back towards photovoltaic cell 33, similar internal reflection occurring for the other subrays such as subray 38.

Figure 3:
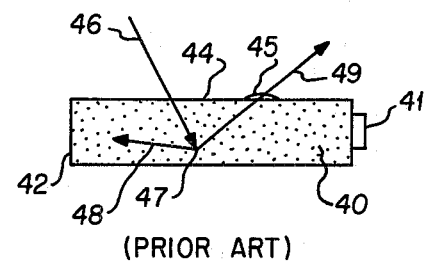
FIG. 3 shows a prior art device.

Prior art devices such as the one shown in FIG. 3 employ a luminescent member 40 having a photovoltaic cell 41 on upstanding edge face 42. When such a device is exposed to normal weather elements or other vagaries of conventional use, e.g., birds, sun oriented side 43 which is the side exposed to such elements becomes dirty, scratched or otherwise contaminated, for example by water drop 45. In this prior art device, when light ray 46 reaches the interior of member 40 and impinges on a luminescent agent particle 47 thereby giving rise to a plurality of subrays, such as subrays 48 and 49, some of the subrays are directed back towards upper surface 44. If those subrays struck upper surface 44 in the area of a residing contaminant such as water drop 45 which drop has an index of refraction closer to the index of refraction of member 40 than the air surrounding side 44, subray 49 would be more likely to escape because of the aid of the intermediate index of refraction contaminant 45. Thus, maximum internal reflection of subrays within prior art member 40 is not achieved.

By the use of the transparent member 11 in FIG. 1 or transparent member 30 in FIG. 2, contaminants are not allowed to reach the upper surface of the luminescent member but rather are kept on the upper surface of the transparent member so that escape of subrays from within the luminescent member as illustrated for FIG. 3 does not occur with the collector of this invention. For example, as can be noted by referring to FIG. 2, contaminants would be retained on upper surface 50 of transparent member 30 and would not reach upper surface 39 of member 31. Thus, subrays 37 and 38 would not have a chance to escape by way of contaminants from the collector of this invention as they would from the collector of the prior art of FIG. 3.

Figure 4:
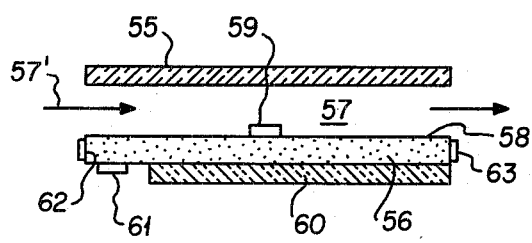
FIG. 4 shows yet another embodiment within this invention.
Figure 5:
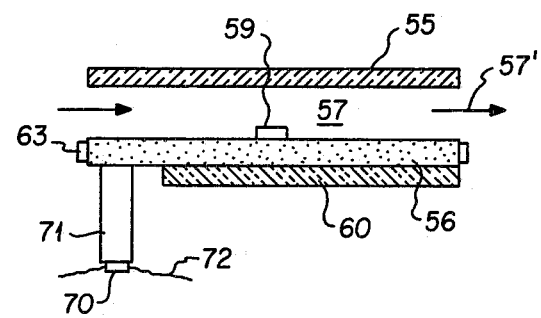
FIG. 5 shows another embodiment within this invention.

FIG. 4 shows a collector within this invention wherein upper transparent member 55 is spaced above lower luminescent member 56 to provide intermediate space 57 through which fluid can flow as shown by arrow 57'. FIG. 4 shows that a photovoltaic means can be employed on the upper surface 58 of member 56 as shown by photovoltaic cell 59. Photovoltaic cell 59 will be directly cooled by the fluid passing through space 57. Such fluid can be substantially heated by its passage through space 57 and therefore energy in the form of heat can be recovered from this fluid in addition to electricity being recovered from the photovoltaic cells. Thus, to maximize the capture of this heat energy, insulation means 60 can be employed on the bottom side of luminescent member 56 to retain heat for capture by the cooling fluid. If photovoltaic means 61 are also employed on the bottom side of member 56, the thermal insulation means is employed over that area of the underside which is not covered by photovoltaic means. Also, to help maximize internal reflection, upstanding edge face 62 of luminescent member 56 can be covered by a reflective means 63 such as a mirror, shiny metal, and the like. Means 63 will tend to reflect light back into the interior of member 56 rather than allowing it to escape through the edge face. p FIG. 5 shows the device of FIG. 4 except that photovoltaic means 61 has been eliminated and replaced by a physically remote photovoltaic means 70, luminescent member 56 and photovoltaic means 70 being optically coupled to one another by optic means 71 which can employ conventional fiber optics techniques although member 71 is not limited to fiber optics. Member 71 could be a right cylindrical solid piece of glass or plastic whose cross-sectional configuration matches the shape of photovoltaic cell 70. As with all other photovoltaic cells described hereinabove, electricity is recovered from the cell by way of wires such as wires 72 for cell 70, the wires for the other cells not being shown for sake of simplicity. By this embodiment, cell 70 is physically removed from member 56 and, therefore, not heated by member 56 when in operation. Cell 70 could be in a cooling fluid stream or otherwise cooled on its own since it can be located away from member 60.

The light transmitting member matrix material and the luminescent member matrix material can be the same or different but are preferably a polymeric or glass material which is transparent at least to the visible light spectrum. Such matrix material can therefore be of conventional plastic polymeric material such as polymethylmethacrylate, other known acrylic polymers, styrene polymers, and the like. The material can be glass or other transparent material into which luminescent agents can be incorporated and which, like the polymeric material, are nondeleterious to the luminescent agents, the photovoltaic cells, and the like. The matrix material can be any light transmitting material heretofore used in the manufacture of conventional nonluminescent photovoltaic devices. The matrix materials preferable do not contain impurities such as iron and the like which would absorb light rather than allow it to pass on to the photovoltaic cell.

The luminescent agents can include metals or oxides or other compounds of metals such as neodymium oxide employed in a glass matrix or one or more laser dyes such as the coumarin family of dyes and the rhodamine family of dyes. These dyes are quite complex chemically. All of these materials and the characteristics thereof are well known in the art and are commercially available so that further detailed description is unnecessary to inform one skilled in the art.

The luminescent agent or agents are simply dispersed in the matrix material by mixing or other dispersion while the matrix material is in a fluid state due to the heating and the like.

Photovoltaic cells are well known in the art and vary widely as to their characteristics and can include, without limitation, silicon, germanium, gallium arsenide, and many other known semiconductor materials.

Reasonable variations and modifications are possible within the scope of this disclosure without departing from the spirit and scope of this invention.

The embodiments of the invention in which an exclusive property or privilege is claimed are defined as follows:

1. A luminescent solar collector comprising at least one luminescent member having at least one photovoltaic means operably associated therewith, said photovolatic means being physically removed from said luminescent member and optically coupled with said luminescent member having at least one side which is adapted to be oriented toward the sun and an edge face, a light transparent member carried adjacent to and in spaced relation from said sun-side of said luminescent member, said transparent member being essentially coextensive with said luminescent member.

2. A collector according to claim 1 wherein at least part of the photovoltaic means are carried on the underside of said luminescent member, and the area of said underside which is not covered by photovoltaic means is essentially covered by thermal insulation means.

3. A collector according to claim 1 wherein at least part of said edge face of said luminescent member carry reflective means.

* * * * *